United States Patent
Yasuda

(10) Patent No.: US 10,075,123 B2
(45) Date of Patent: Sep. 11, 2018

(54) SEMICONDUCTOR DEVICE, MOTOR CONTROL SYSTEM, AND CONTROL METHOD FOR SEMICONDUCTOR DEVICE

(71) Applicant: RENESAS ELECTRONICS CORPORATION, Tokyo (JP)

(72) Inventor: Yusuke Yasuda, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 15/719,474

(22) Filed: Sep. 28, 2017

(65) Prior Publication Data
US 2018/0097465 A1    Apr. 5, 2018

(30) Foreign Application Priority Data

Oct. 5, 2016  (JP) .................. 2016-197316

(51) Int. Cl.
| | | |
|---|---|---|
| *G05B 1/06* | (2006.01) | |
| *H02P 29/024* | (2016.01) | |
| *G01D 5/20* | (2006.01) | |
| *H03M 1/48* | (2006.01) | |
| *H02P 27/08* | (2006.01) | |

(52) U.S. Cl.
CPC ............. *H02P 29/024* (2013.01); *G01D 5/20* (2013.01); *H02P 27/085* (2013.01); *H03M 1/485* (2013.01)

(58) Field of Classification Search
CPC ........ G05B 19/21; G05B 19/31; G05B 19/27; G05B 19/33; G05B 1/06; H02K 29/06; H02K 29/08; H03M 1/00; H03M 1/48; H02P 1/00; H02P 6/00; H02P 21/00; H02P 23/00
USPC ..... 318/605, 661, 400.39, 400.01, 700, 701, 318/727, 800; 341/112, 116, 126, 128, 341/129
See application file for complete search history.

(56) References Cited

U.S. PATENT DOCUMENTS 4,740,778 A * 4/1988 Harding ................... G01D 3/10
172/3
7,138,795 B2 * 11/2006 Ura ........................ G01D 3/032
324/207.25

FOREIGN PATENT DOCUMENTS

JP    2007-006195 A    1/2007

* cited by examiner

*Primary Examiner* — Antony M Paul
(74) *Attorney, Agent, or Firm* — McDermott Will & Emery LLP

(57) ABSTRACT

A semiconductor device according to one embodiment selects one of the first and second resolver/digital converters and interrupts a supply of a power supply voltage to the other one of the first and second resolver/digital converters, and when an error is detected in the selected one of the first and second resolver/digital converters, the semiconductor device starts the supply of the voltage to the other one of the first and second resolver/digital converters, and switches the one of the first and second resolver/digital converters to the other one of the first and second resolver/digital converters.

15 Claims, 8 Drawing Sheets

SEMICONDUCTOR DEVICE, MOTOR CONTROL SYSTEM, AND CONTROL METHOD FOR SEMICONDUCTOR DEVICE

CROSS-REFERENCE TO RELATED APPLICATIONS

This application is based upon and claims the benefit of priority from Japanese patent application No. 2016-197316, filed on Oct. 5, 2016, the disclosure of which is incorporated herein in its entirety by reference.

BACKGROUND

The present disclosure relates to a semiconductor device, a motor control system, and a control method for a semiconductor device.

A motor control system is known in which a rotation angle of a motor is detected by a resolver, and a detected analog signal is converted into a digital signal by a resolver/digital converter, thereby performing feedback control of a motor.

For example, in motor-driven vehicles, such as an electric vehicle and a hybrid vehicle, even when an abnormality has occurred in the resolver/digital converter, it is necessary to continuously drive the motor so as to allow at least the vehicle to evacuate safely.

FIG. 4 of Japanese Unexamined Patent Application Publication No. 2007-006195 discloses a communication device including an active system transmitter and a standby system transmitter. In the communication device disclosed in Japanese Unexamined Patent Application Publication No. 2007-006195, if an abnormality has occurred in the active system transmitter, the communication can be continued by switching the active system transmitter to a standby system transmitter.

SUMMARY

In the communication device disclosed in Japanese Unexamined Patent Application Publication No. 2007-006195, during a period in which a power supply voltage is being supplied to the active system transmitter and it is operating, the power supply voltage is also supplied to the standby system transmitter and it is also continuously operating. This causes a problem that power consumption increases.

Other problems to be solved by and novel features of the present invention will become apparent from the following description and the drawings.

According to one embodiment, a semiconductor device selects one of first and second resolver/digital converters and interrupts a supply of a power supply voltage to the other one of the first and second resolver/digital converters, and when an error is detected in the selected one of the first and second resolver/digital converters, the semiconductor device starts the supply of the voltage to the other one of the first and second resolver/digital converters, and switches the one of the first and second resolver/digital converters to the other one of the first and second resolver/digital converters.

According to the one embodiment, power consumption can be suppressed.

BRIEF DESCRIPTION OF THE DRAWINGS

The above and other aspects, advantages and features will be more apparent from the following description of certain embodiments taken in conjunction with the accompanying drawings, in which.

DETAILED DESCRIPTION

Figure 1:
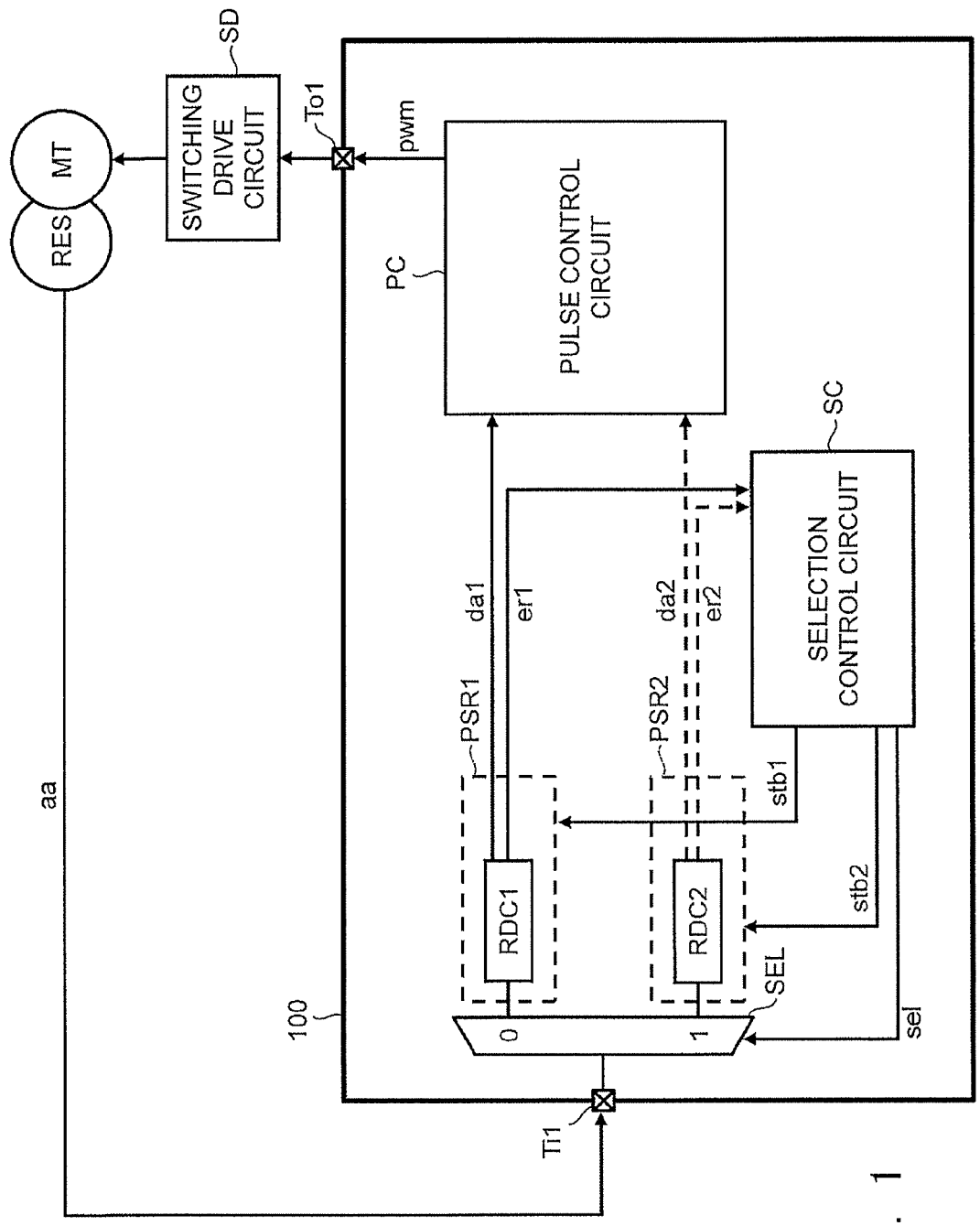
FIG. 1 is a block diagram showing a configuration of a semiconductor device 100 according to a first embodiment.

The following description and the drawings are abbreviated and simplified as appropriate for clarity of explanation. The elements illustrated in the drawings as functional blocks for performing various processings maybe implemented hardwarewise by a CPU, a memory, and other circuits, and softwarewise by a program loaded into a memory or the like. Accordingly, it is understood by those skilled in the art that the functional blocks may be implemented in various forms including hardware alone, software alone, and combinations thereof, and not limited to any of them. Note that in the drawings, the same elements are denoted by the same reference numerals, and a repeated description is omitted as needed.

First Embodiment

<Configuration of Semiconductor Device 100>

First, a semiconductor device and a motor control system according to a first embodiment will be described with reference to FIG. 1. FIG. 1 is a block diagram showing a configuration of a semiconductor device 100 according to the first embodiment. As shown in FIG. 1, the semiconductor device 100 according to the first embodiment includes resolver/digital converters RDC1 and RDC2, a selector SEL, a pulse control circuit PC, and a selection control circuit SC.

The semiconductor device 100 outputs a pulse control signal pwm for controlling a switching drive circuit SD based on a resolver signal aa which is output from a resolver RES. The example of FIG. 1 shows a motor control system in which the resolver RES detects a rotation angle of a motor MT and the switching drive circuit SD drives the motor MT based on the pulse control signal pwm output from the semiconductor device 100. That is, the semiconductor device 100 is a semiconductor device for motor control that constitutes the motor control system.

The resolver/digital converter (first resolver/digital converter) RDC1 converts the resolver signal aa, which is an analog angular signal output from the resolver RES, into a digital angular signal da1, and outputs the digital angular signal da1 to the pulse control circuit PC. The resolver/digital converter RDC1 is formed in a power supply region (first power supply region) PSR1.

Further, the resolver/digital converter RDC1 outputs an error signal er1 to the selection control circuit SC. In this embodiment, if an abnormality occurs in the resolver/digital converter RDC1, the error signal er1 is temporarily switched from "0" to "1". That is, a pulse signal is output.

The resolver/digital converter (second resolver/digital converter) RDC2 converts the resolver signal aa into a digital angular signal da2, and outputs the digital angular signal da2 to the pulse control circuit PC. The resolver/digital converter RDC2 is formed in a power supply region (second power supply region) PSR2 which is isolated from the power supply region PSR1.

The resolver/digital converter RDC2 outputs an error signal er2 to the selection control circuit SC. In this embodiment, if an abnormality occurs in the resolver/digital converter RDC2, the error signal er2 is temporarily switched from "0" to "1". That is, a pulse signal is output.

The selector (selection circuit) SEL selects one of the resolver/digital converters RDC1 and RDC2 based on a selection control signal sel output from the selection control circuit SC. The selector SEL outputs the resolver signal aa, which is received from the resolver RES through an input terminal Ti1, to the selected one of the resolver/digital converters RDC1 and RDC2. In the example of FIG. 1, when the value of the selection control signal sel is "0" (Low), the selector SEL selects the resolver/digital converter RDC1. On the other hand, when the value of the selection control signal sel "1" (High), the selector SEL selects the resolver/digital converter RDC2.

FIG. 1 illustrates a case where the value of the selection control signal sel is "0" and the resolver/digital converter RDC1 is selected by the selector SEL. Accordingly, the digital angular signal da1 and the error signal er1 which are output from the resolver/digital converter RDC1 are each indicated by a solid line. On the other hand, the digital angular signal da2 and the error signal er2 which are output from the resolver/digital converter RDC2 are each indicated by a broken line.

The pulse control circuit PC generates the pulse control signal pwm based on the digital angular signal da1 output from the resolver/digital converter RDC1, or the digital angular signal da2 output from the resolver/digital converter RDC2. The pulse control signal pwm is output to the external switching drive circuit SD through an output terminal Tot. In this embodiment, the pulse control signal pwm is a pulse width modulation (PWM) signal. However, other pulse modulation signals may also be used.

The selection control circuit SC outputs the selection control signal sel, and controls the selector SEL. Specifically, the selection control circuit SC switches one of the resolver/digital converters RDC1 and RDC2 to the other one of the resolver/digital converters RDC1 and RDC2.

Further, the selection control circuit SC outputs a standby signal stb1 for switching between supply and interruption of a power supply voltage to the power supply region PSR1, and a standby signal stb2 for switching between supply and interruption of the power supply voltage to the power supply region PSR2. In this embodiment, when the standby signals stb1 and stb2 indicate "1", the power supply voltage is supplied, and when the standby signals stb1 and stb2 indicate "0", the power supply voltage is interrupted, although this can be reversed.

In this embodiment, the selection control circuit SC first starts supplying the power supply voltage to the power supply region PSR1, and selects the resolver/digital converter RDC1. On the other hand, the selection control circuit SC interrupts the supply of the power supply voltage to the resolver/digital converter RDC2, i.e., the power supply region PSR2.

When an abnormality is detected in the selected resolver/digital converter RDC1 and the error signal er1 is switched to "1", the selection control circuit SC starts supplying the voltage to the resolver/digital converter RDC2, i.e., the power supply region PSR2. Further, the selection control circuit SC switches the selection control signal sel from "0" to "1", and switches the resolver/digital converter RDC1 to the resolver/digital converter RDC2.

<Description of Advantageous Effects>

The semiconductor device 100 according to this embodiment includes two resolver/digital converters RDC1 and RDC2. Accordingly, even if an abnormality occurs in one of the resolver/digital converters (e.g., the resolver/digital converter RDC1) that is currently used, a control target can be continuously controlled by the other one of the resolver/digital converters (e.g., the resolver/digital converter RDC2) that is not currently used.

The two resolver/digital converters RDC1 and RDC2 are formed in different power supply regions PSR1 and PSR2, respectively, which are isolated from each other. Accordingly, during a period in which, for example, the resolver/digital converter RDC1 is operating, the supply of the power supply voltage to the standby resolver/digital converter RDC2 can be interrupted. Accordingly, the power consumption can be suppressed. Further, during a period in which the resolver/digital converter RDC1 is normally operating, the resolver/digital converter RDC2 does not operate. In other words, the resolver/digital converter RDC2 does not receive any electrical stress, so that the occurrence of a failure in the resolver/digital converter RDC2 can be suppressed.

<Detailed Configuration of Semiconductor Device 100>

Figure 2:
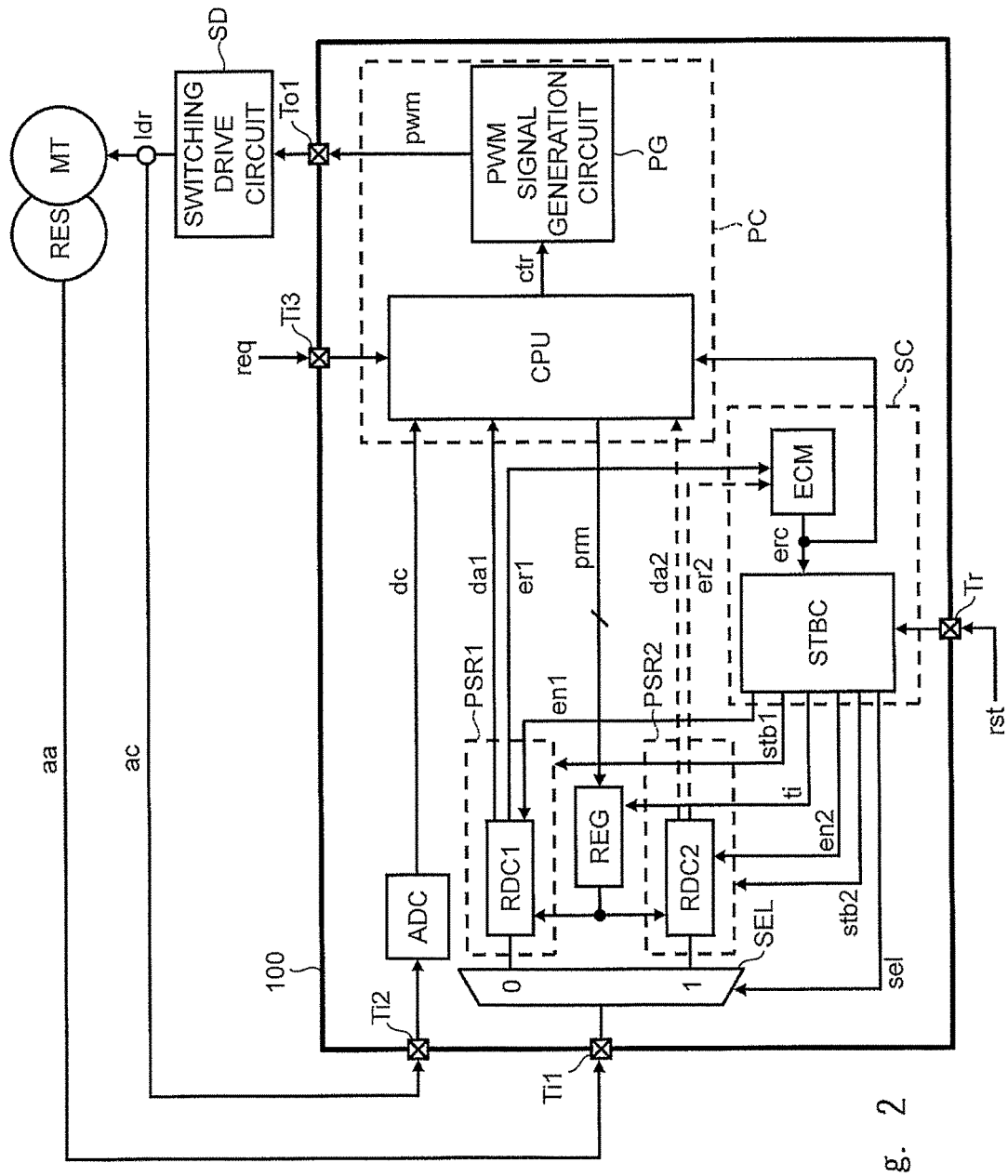
FIG. 2 is a detailed block diagram showing the configuration of the semiconductor device 100 according to the first embodiment.

Next, the semiconductor device according to the first embodiment will be described in detail with reference to FIG. 2. FIG. 2 is a detailed block diagram showing the configuration of the semiconductor device 100 according to the first embodiment. As shown in FIG. 2, the semiconductor device 100 according to the first embodiment includes an analog/digital converter ADC and a register REG, in addition to the resolver/digital converters RDC1 and RDC2, the selector SEL, the pulse control circuit PC, and the selection control circuit SC which are shown in FIG. 1. The pulse control circuit PC includes a processing unit CPU and a PWM signal generation circuit PG. The selection control circuit SC includes an error control unit ECM and a standby control circuit STBC.

The analog/digital converter ADC converts an analog current signal ac into a digital current signal dc, and outputs the digital current signal dc to the pulse control circuit PC. The analog current signal ac is obtained by detecting a drive current Idr output from the switching drive circuit, and is input through an input terminal Ti2.

The resolver/digital converter RDC1 converts the resolver signal aa, which is output from the resolver RES, into the digital angular signal da1 by using a parameter prm which is transferred from the register REG, and outputs the digital angular signal da1 to the pulse control circuit PC. The resolver/digital converter RDC1 is formed in the power supply region PSR1.

The resolver/digital converter RDC1 outputs the error signal er1 to the error control unit ECM.

The resolver/digital converter RDC2 converts the resolver signal aa into the digital angular signal da2 by using the parameter prm transferred from the register REG, and outputs the digital angular signal da2 to the pulse control circuit PC. The resolver/digital converter RDC2 is formed in the power supply region PSR2 which is isolated from the power supply region PSR1.

Further, the resolver/digital converter RDC2 outputs the error signal er2 to the error control unit ECM.

The selector SEL selects one of the resolver/digital converters RDC1 and RDC2 based on the selection control signal sel output from the standby control circuit STBC. The selector SEL outputs the resolver signal aa, which is received from the resolver RES through the input terminal Ti1, to the selected one of the resolver/digital converters RDC1 and RDC2. In the example of FIG. 2, when the value of the selection control signal sel is "0", the selector SEL selects the resolver/digital converter RDC1. On the other hand, when the value of the selection control signal sel is "1", the selector SEL selects the resolver/digital converter RDC2.

The processing unit CPU generates a control signal ctr based on the digital angular signal da1 output from the resolver/digital converter RDC1, or the digital angular signal da2 output from the resolver/digital converter RDC2, the digital current signal dc, and a request signal req. The control signal ctr is output to the PWM signal generation circuit PG. The processing unit CPU is, for example, a CPU (Central Processing Unit). The request signal req is, for example, a signal indicating a target value of the number of revolutions of the motor MT, and is input through an input terminal Ti3.

The processing unit CPU calculates the current number of revolutions of the motor MT from the digital angular signal da1 or da2, which are fed back from the motor MT, and the digital current signal dc. Further, the processing unit CPU compares the calculated current number of revolutions of the motor MT with the request signal req, and outputs the control signal ctr for increasing or decreasing the number of revolutions of the motor MT.

The PWM signal generation circuit PG generates the pulse control signal pwm based on the control signal ctr output from the processing unit CPU, and outputs the generated pulse control signal pwm to the external switching drive circuit SD through the output terminal To1.

The error control unit ECM outputs an error signal erc according to the error signal er1 output from the resolver/digital converter RDC1, or the error signal er2 output from the resolver/digital converter RDC2, to the standby control circuit STBC and the processing unit CPU. The error control unit ECM receives a plurality of error signals (not shown), and the error control unit ECM determines the priority of each of the error signals and sequentially processes the error signals in a descending order of priority. Specifically, when the error signal er1 received from the resolver/digital converter RDC1, or the error signal er2 received from the resolver/digital converter RDC2 has a highest priority, the error signal erc is output to the standby control circuit STBC.

The standby control circuit STBC outputs the selection control signal sel based on the error signal erc and a reset signal rst, and controls the selector SEL. That is, the standby control circuit STBC switches one of the resolver/digital converters RDC1 and RDC2 to the other one of the resolver/digital converters RDC1 and RDC2. The reset signal rst is input through the reset terminal Tr. The reset signal rst is also input to other functional blocks, such as the analog/digital converter ADC, the processing unit CPU, the PWM signal generation circuit PG, and the error control unit ECM, the illustration of which is omitted in FIG. 2.

The standby control circuit STBC outputs the standby signal stb1 for switching between supply and interruption of the power supply voltage to the power supply region PSR1, and the standby signal stb2 for switching between supply and interruption of the power supply voltage to the power supply region PSR2.

The standby control circuit STBC outputs an enable signal en1 for causing the resolver/digital converter RDC1 to operate, and an enable signal en2 for causing the resolver/digital converter RDC2 to operate.

Further, the standby control circuit STBC outputs a transfer instruction ti to the register REG.

In the register REG, the parameter prm for resolver/digital conversion processing is set by the processing unit CPU. The register REG transfers the parameter prm to the resolver/digital converters RDC1 and RDC2 in response to the transfer instruction ti from the standby control circuit STBC. Accordingly, even when the resolver/digital converters RDC1 and RDC2 are switched, the resolver/digital conversion processing can be continued.

In the semiconductor device 100 according to this embodiment, the standby control circuit STBC first starts supplying the power supply voltage to the power supply region PSR1 and selects the resolver/digital converter RDC1. On the other hand, the standby control circuit STBC interrupts the supply of the power supply voltage to the resolver/digital converter RDC2, i.e., the power supply region PSR2.

When an abnormality is detected in the selected resolver/digital converter RDC1 and the error signal er1 is switched to "1", the standby control circuit STBC starts supplying the voltage to the resolver/digital converter RDC2, i.e., the power supply region PSR2. Further, the standby control circuit STBC switches the selection control signal sel from "0" to "1", and switches the resolver/digital converter RDC1 to the resolver/digital converter RDC2.

<Description of Advantageous Effects>

Figure 8:
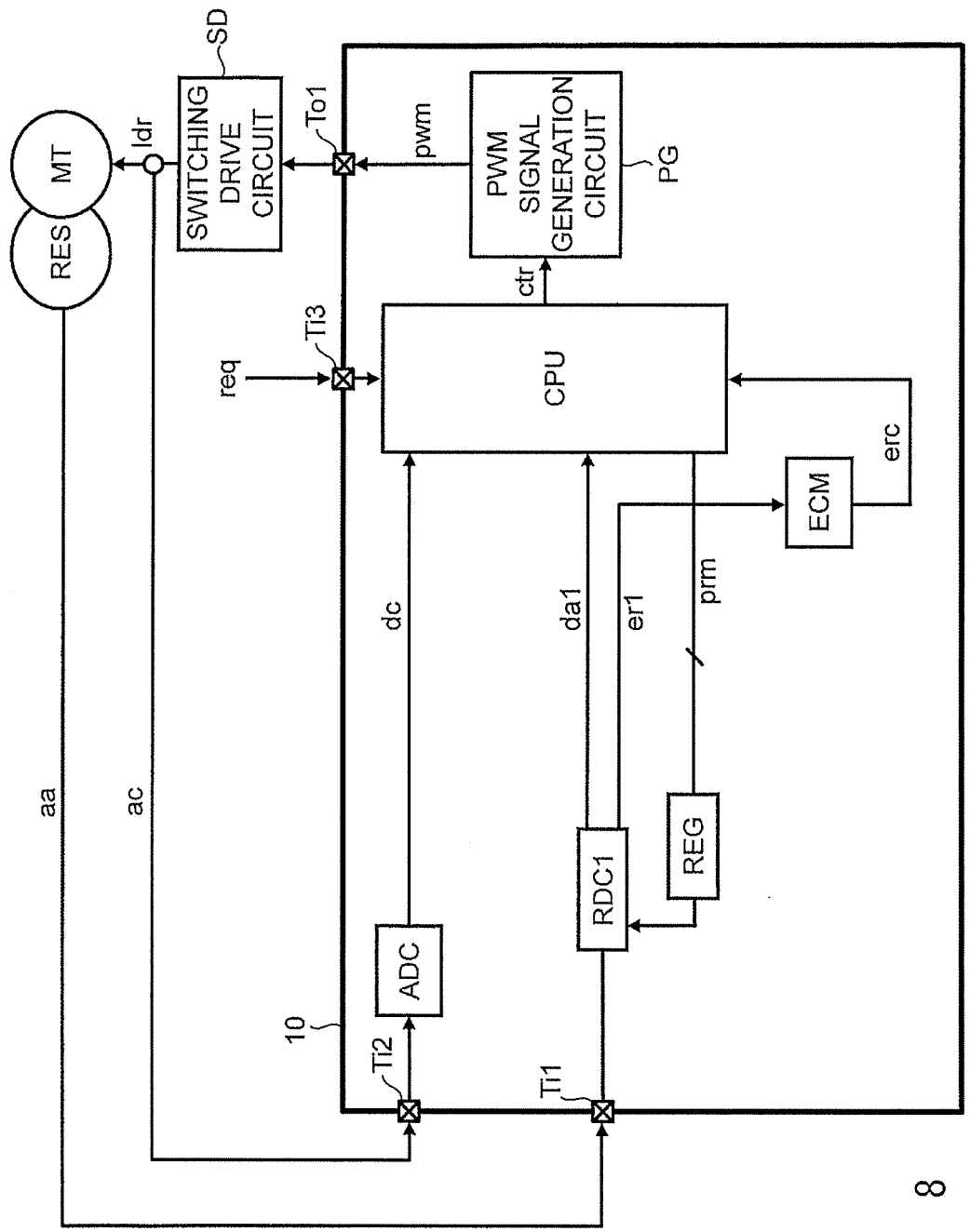
FIG. 8 is a block diagram showing a configuration of a semiconductor device 10 according to a comparative example of the first embodiment.

A semiconductor device 10 according to a comparative example of the first embodiment will now be described with reference to FIG. 8. FIG. 8 is a block diagram showing the configuration of the semiconductor device 10 according to the comparative example of the first embodiment. As shown in FIG. 8, the semiconductor device 10 according to the comparative example includes only the resolver/digital converter RDC1. That is, the semiconductor device 10 according to the comparative example does not include the selector SEL and the standby control circuit STBC which are included in the semiconductor device 100 according to the first embodiment shown in FIG. 2. Accordingly, in the semiconductor device 10 according to the comparative example, if an abnormality occurs in the resolver/digital converter RDC1, the processing unit CPU needs to control the motor MT to be stopped based on the error signal erc output from the error control unit ECM. Specifically, for example, when the semiconductor device 10 according to the comparative example is applied to a motor control system for controlling a motor for driving a vehicle, the system needs to be stopped in consideration of the safety during the occurrence of an abnormality as mentioned above, so that the motor control cannot be continued.

On the other hand, the semiconductor device 100 according to this embodiment includes two resolver/digital converters RDC1 and RDC2. Accordingly, even if an abnormality occurs in the resolver/digital converter RDC1 currently being used, a control target can be continuously controlled by the resolver/digital converter RDC2 which is not currently used. For this reason, the semiconductor device 100 is suitable for, for example, a motor control system for controlling a motor for driving a vehicle, which is required to ensure safety.

The two resolver/digital converters RDC1 and RDC2 are formed in the power supply regions PSR1 and PSR2, respectively, which are different regions isolated from each other. Therefore, for example, when the resolver/digital converter RDC1 is operating, the supply of the power supply voltage to the standby resolver/digital converter RDC2 can be interrupted. Accordingly, the power consumption can be suppressed. When the resolver/digital converter RDC1 is normally operating, the resolver/digital converter RDC2 does not operate. In other words, the resolver/digital converter RDC2 does not receive any electrical stress, so that not only the probability of occurrence of an abnormality in the resolver/digital converter RDC1, but also the probability of occurrence of an abnormality in the resolver/digital converter RDC2 can be suppressed.

<Detailed Configuration of Standby Control Circuit STBC>

Figure 3:
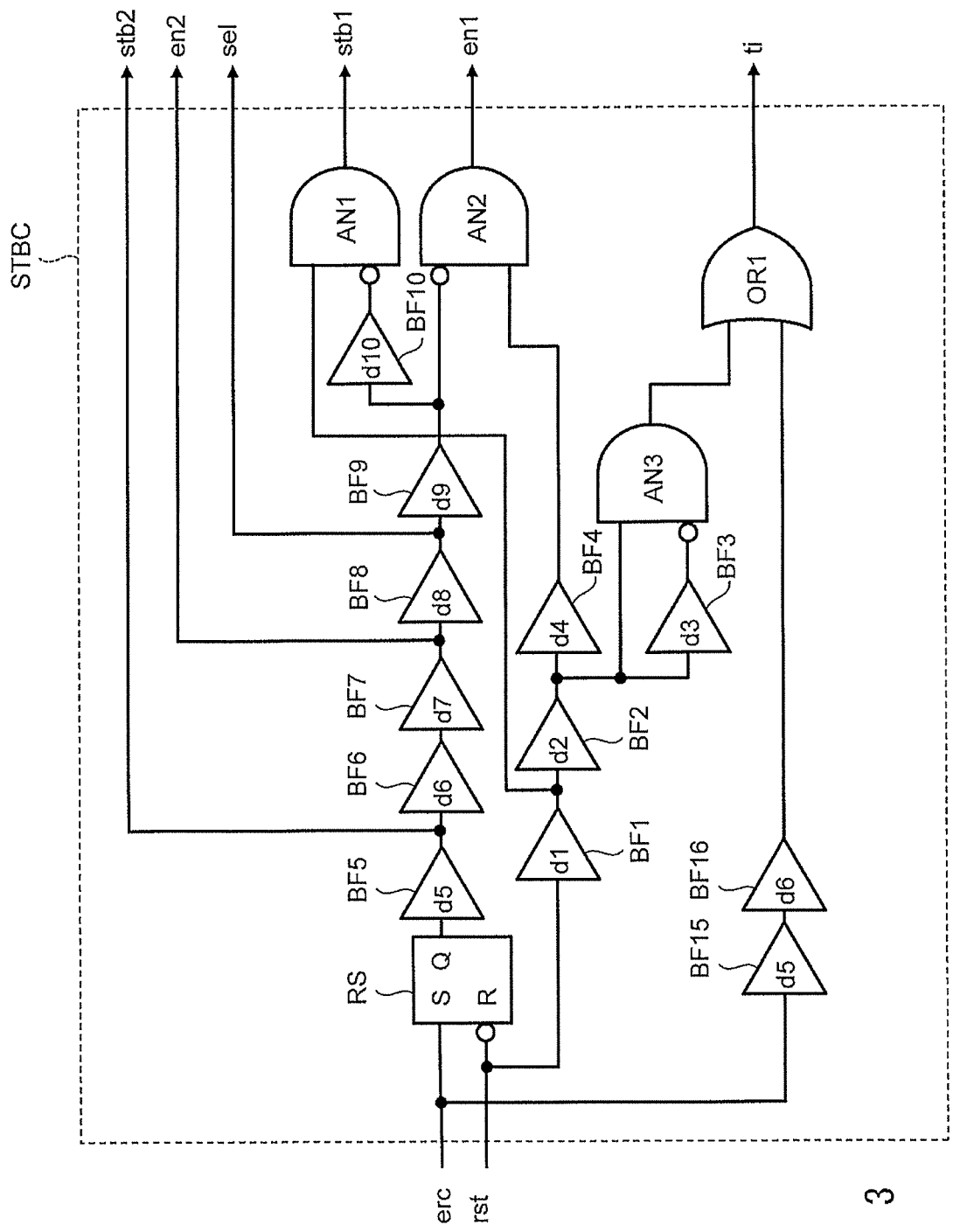
FIG. 3 is a circuit diagram showing an example of a configuration of a standby control circuit STBC.
Figure 4:
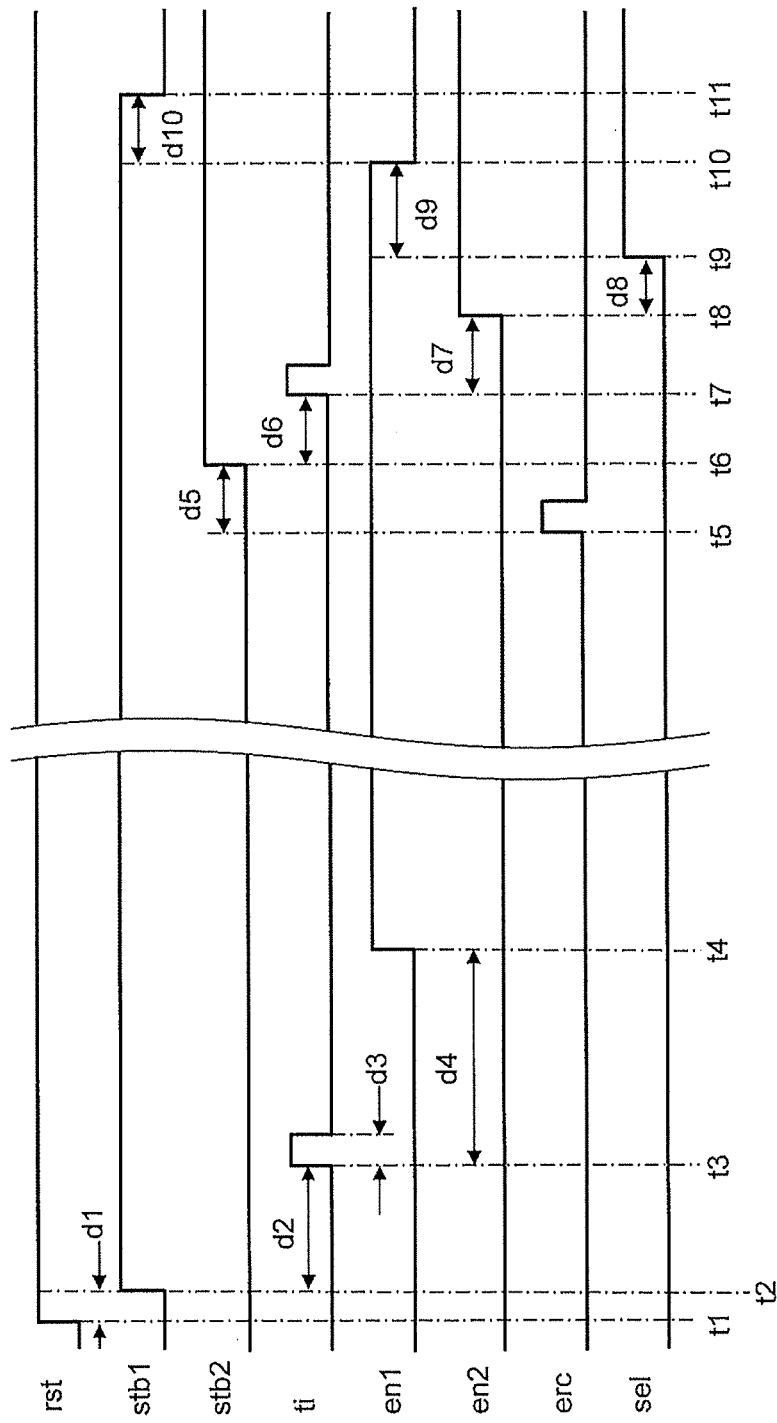
FIG. 4 is a timing diagram showing an example of an operation of the standby control circuit STBC.

Next, the detailed configuration and operation of the standby control circuit STBC will be described with reference to FIGS. 3 and 4. FIG. 3 is a circuit diagram showing an example of the configuration of the standby control circuit STBC. FIG. 4 is a timing diagram showing an example of the operation of the standby control circuit STBC.

First, the configuration of the standby control circuit STBC will be described with reference to FIG. 3. As shown in FIG. 3, the standby control circuit STBC includes an RS latch circuit RS, AND gates AN1 to AN3, an OR gate OR1, delay buffers BF1 to BF10, a BF15, and a BF16. FIG. 3 shows a delay time d1 in a triangular symbol representing the delay buffer BF1. This delay time d1 is a delay time indicated in the timing diagram of FIG. 4. The same holds true for the other delay buffers.

A setting input terminal S of the RS latch circuit RS receives the error signal erc. A resetting input terminal R of the RS latch circuit RS receives an inverted signal of the reset signal rst. If an abnormality occurs in the resolver/digital converter RDC1 currently used and a pulse is generated in the error signal erc, a signal output from an output terminal Q of the RS latch circuit RS is switched from "0" to "1" and is held.

The output terminal Q of the RS latch circuit RS is connected with the delay buffer BF5 for a delay time d5. The standby signal stb2 for switching between supply and interruption of the power supply voltage to the power supply region PSR2 is output from the delay buffer BF5. Specifically, after a lapse of the delay time d5 from a rising edge of the error signal erc, the standby signal stb2 is switched from "0" to "1", and the supply of the power supply voltage to the power supply region PSR2 is started.

The delay buffer BF6 for a delay time d6 is connected to an output of the delay buffer BF5, and the delay buffer BF7 for a delay time d7 is connected to an output of the delay buffer BF6. The enable signal en2 for causing the resolver/digital converter RDC2 to operate is output from the delay buffer BF7. Specifically, after a lapse of a delay time d6+d7 after the standby signal stb2 is switched from "0" to "1", the enable signal en2 is switched from "0" to "1" and the resolver/digital converter RDC2 starts operation.

Note that, for ease of explanation, the delay buffers BF6 and BF7 shown in FIG. 3 are separately illustrated to facilitate comparison between the delay buffers with reference to the timing diagram shown in FIG. 4.

An output of the delay buffer BF7 is connected with the delay buffer BF8 for a delay time d8. The selection control signal sel for controlling the selector SEL is output from the delay buffer BF8. Specifically, after a lapse of the delay time d8 after the enable signal en2 is switched from "0" to "1", the target to be selected by the selector SEL is switched from the resolver/digital converter RDC1 to the resolver/digital converter RDC2.

An output of the delay buffer BF8 is connected with a delay buffer BF9 for a delay time d9. An output of the delay buffer BF9 is connected with a delay buffer BF10 for a delay time d10. An inverted signal of the output signal from the delay buffer BF10 is input to the AND gate AN1. The AND gate AN1 also receives a signal delayed from the reset signal rst by the delay buffer BF1 for the delay time d1. That is, the AND gate AN1 receives the inverted signal of the output signal from the delay buffer BF10 and the output signal from the delay buffer BF1. Further, the standby signal stb1 for switching between supply and interruption of the power supply voltage to the power supply region PSR1 is output from the AND gate AN1.

With such a circuit configuration, after a lapse of the delay time d1 from a rising edge of the reset signal rst when a reset is released, the standby signal stb1 is switched from "0" to "1", and the supply of the power supply voltage to the power supply region PSR1 is started. On the other hand, after a lapse of a delay time d5+d6+d7+d8+d9+d10 from a rising edge of the error signal erc, the standby signal stb1 is switched from "1" to "0", and the supply of the power supply voltage to the power supply region PSR1 is interrupted.

An inverted signal of the output signal from the delay buffer BF9 is input to an AND gate AN2. The AND gate AN2 also receives a signal delayed from the output signal from the delay buffer BF1 by the delay buffer BF2 for the delay time d2 and the delay buffer BF4 for the delay time d4. That is, the AND gate AN2 receives the inverted signal of the output signal from the delay buffer BF9 and the output signal from the delay buffer BF4. Further, the enable signal en1 for causing the resolver/digital converter RDC1 to operate is output from the AND gate AN2.

With such a circuit configuration, after a lapse of a delay time d1+d2+d4 from a rising edge of the reset signal rst when a reset is released, the enable signal en1 is switched from "0" to "1" and the resolver/digital converter RDC1 starts operation. On the other hand, after a lapse of a delay time d5+d6+d7+d8+d9 after a rising edge of the error signal erc, the enable signal en1 is switched from "1" to "0" and the resolver/digital converter RDC1 stops operation.

An output signal from the delay buffer BF2 is input to the AND gate AN3. The AND gate AN3 also receives an inverted signal of the output signal from the delay buffer BF2 that is delayed by the delay buffer BF3 for the delay time d3. That is, the AND gate AN3 receives the output signal from the delay buffer BF2 and the inverted signal of the output signal from the delay buffer BF3. The output signal from the AND gate AN3 is a pulse signal which has the width d3 and rises after a lapse of a delay time d1+d2 from a rising edge of the reset signal rst.

The output signal from the AND gate AN3 is input to the OR gate OR1. The OR gate OR1 also receives the pulse signal delayed from the error signal erc by the delay buffer BF15 for the delay time d5 and the delay buffer BF16 for the delay time d6. Further, the transfer instruction ti is output from the OR gate OR1.

With such a circuit configuration, the transfer instruction ti is output after a lapse of a delay time d1+d2 from a time when a reset is released, and after a lapse of a delay time d5+d6 from the generation of the error signal erc.

Note that, for ease of explanation, the delay buffers BF15 and BF16 shown in FIG. 3 are separately illustrated to facilitate comparison between the delay buffers with reference to the timing diagram shown in FIG. 4.

<Detailed Operation of Standby Control Circuit STBC>

Next, a control method for the semiconductor device according to this embodiment will be described with reference to FIG. 4. Specifically, the operation of the standby control circuit STBC will be described. FIG. 4 shows the reset signal rst, the standby signal stb1, the standby signal stb2, the transfer instruction ti, the enable signal en1, the enable signal en2, the error signal ers, and the selection control signal sel in order from the top.

First, at a time t1, a reset is released and the reset signal rst is switched from "0" to "1".

Next, at a time t2 after a lapse of the delay time d1 from the time t1, the standby signal stb1 is switched from "0" to "1", and the supply of the power supply voltage to the power supply region PSR1 is started.

Next, at a time t3 after a lapse of the delay time d2 from the time t2, the transfer instruction ti is switched from "0" to "1" and the parameter prm is transferred from the register REG to the resolver/digital converter RDC1.

Next, at a time t4 after a lapse of the delay time d4 from the time t3, the enable signal en1 is switched from "0" to "1", and the resolver/digital converter RDC1 starts operation.

At a time t5, when the error signal ers, which is a pulse signal, is switched from "0" to "1". At a time t6 after a lapse of the delay time d5 from the time t5, the standby signal stb2 is switched from "0" to "1", and the supply of the power supply voltage to the power supply region PSR2 is started.

Next, at a time t7 after a lapse of the delay time d6 from the time t6, the transfer instruction ti is switched from "0" to "1", and the parameter prm is transferred from the register REG to the resolver/digital converters RDC1 and RDC2.

Next, at a time t8 after a lapse of the delay time d7 from the time t7, the enable signal en2 is switched from "0" to "1", and the resolver/digital converter RDC2 starts operation.

Next, at a time t9 after a lapse of the delay time d8 from the time t8, the selection control signal sel is switched from "0" to "1", and the target to be selected by the selector SEL is switched from the resolver/digital converter RDC1 to the resolver/digital converter RDC2.

Next, at a time t10 after a lapse of the delay time d9 from the time t9, the enable signal en1 is switched from "1" to "0", and the resolver/digital converter RDC1 stops operation.

Lastly, at a time t11 after a lapse of the delay time d10, the standby signal stb1 is switched from "1" to "0", and the supply of the power supply voltage to the power supply region PSR1 is interrupted.

Second Embodiment

<Detailed Configuration of Standby Control Circuit STBC>

Figure 5:
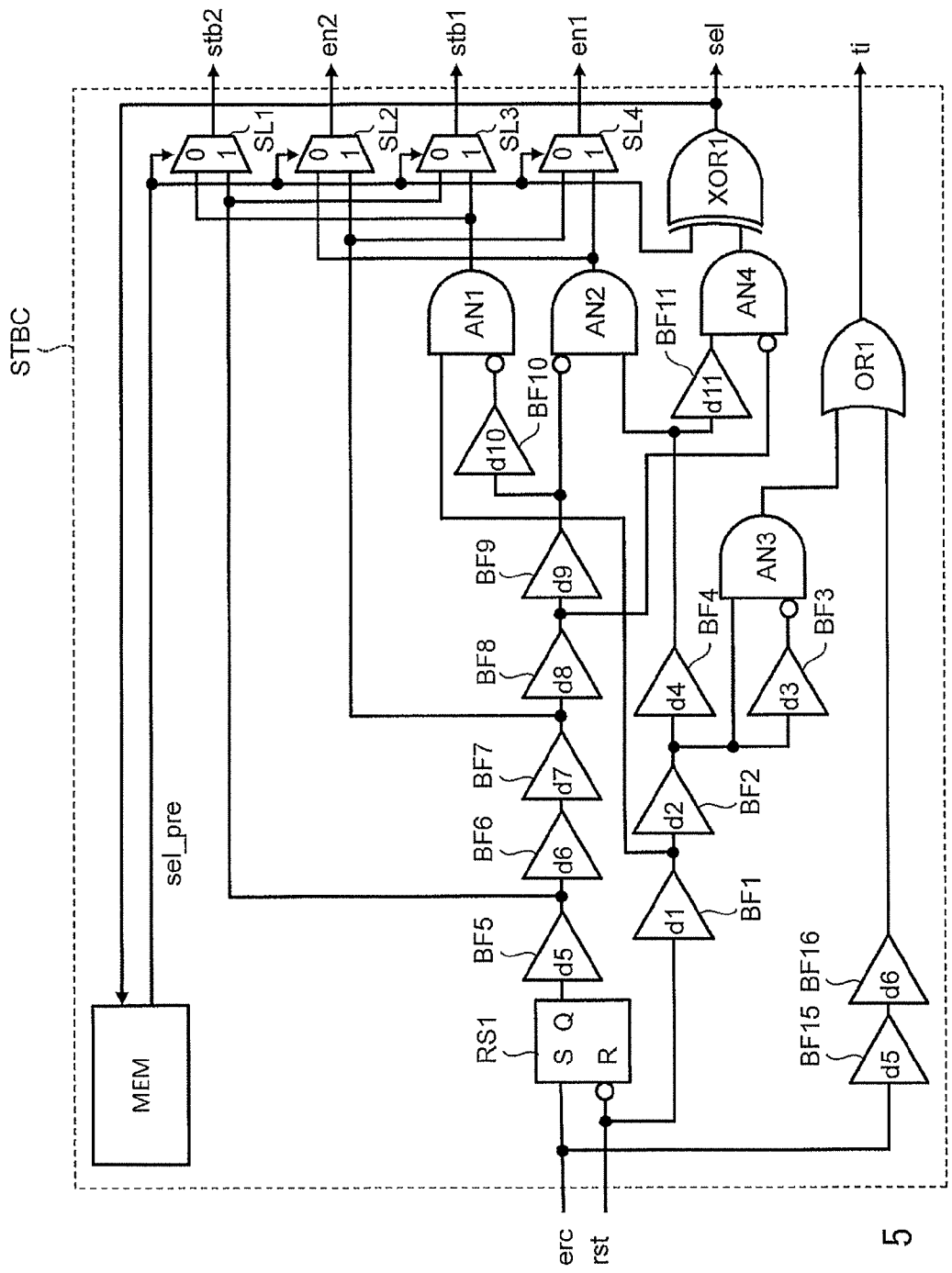
FIG. 5 is a circuit diagram showing an example of a configuration of the standby control circuit STBC in the semiconductor device 100 according to a second embodiment.
Figure 6:
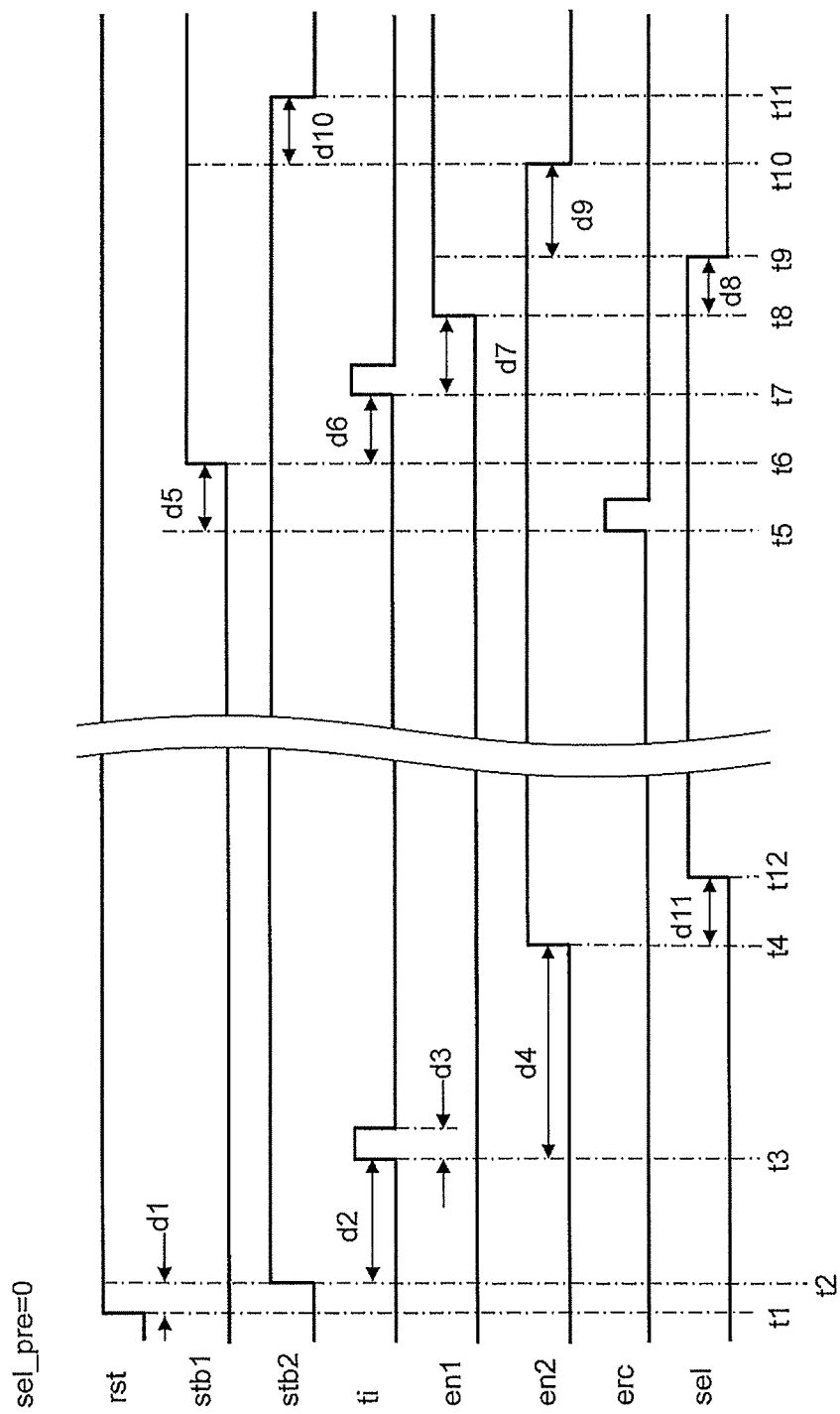
FIG. 6 is a timing diagram showing an example of an operation of the standby control circuit STBC.
Figure 7:
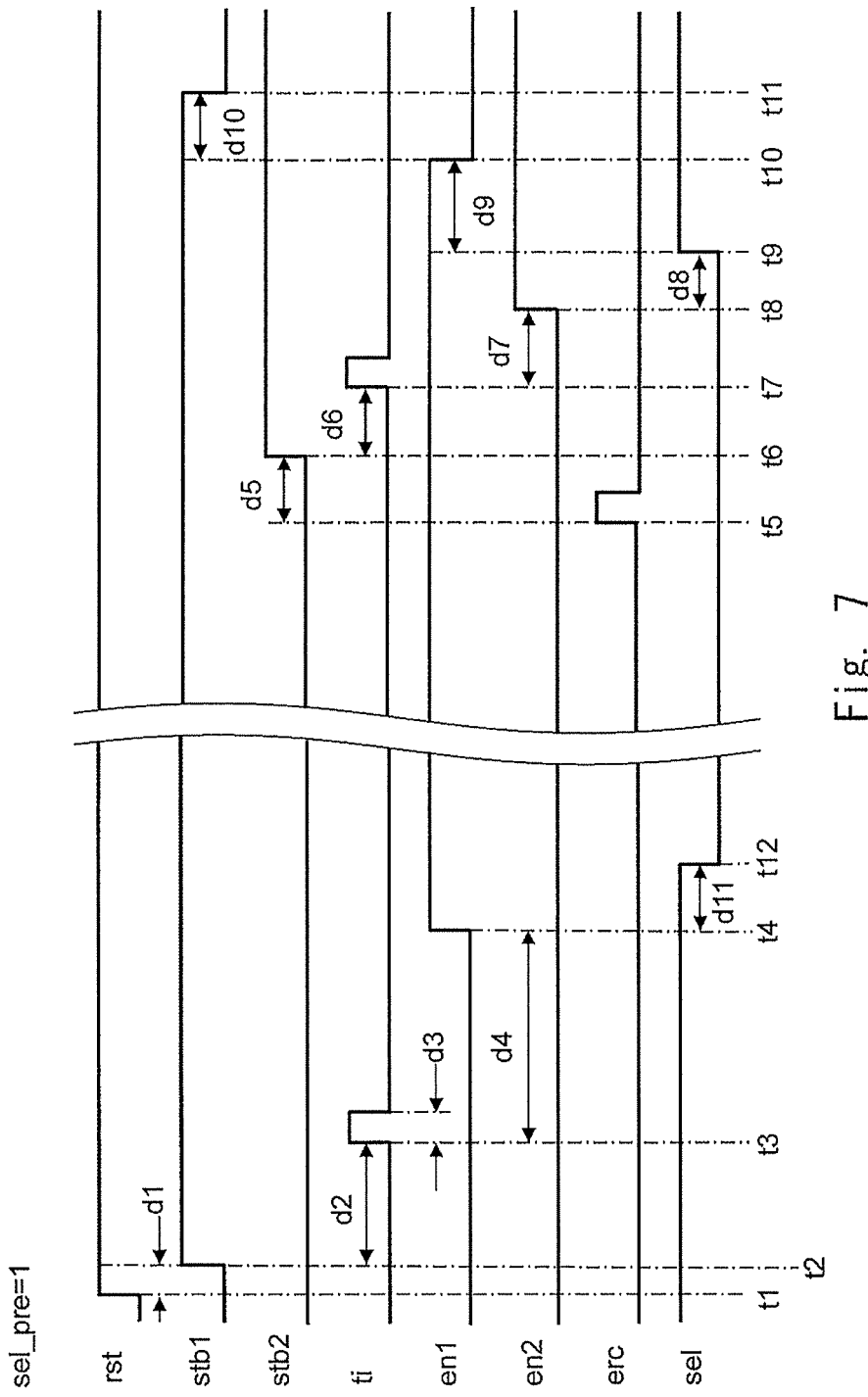
FIG. 7 is a timing diagram showing an example of the operation of the standby control circuit STBC.

Next, a detailed configuration and operation of the standby control circuit STBC in the semiconductor device 100 according to a second embodiment will be described with reference to FIGS. 5 to 7. FIG. 5 is a circuit diagram showing an example of the configuration of the standby control circuit STBC in the semiconductor device 100 according to the second embodiment. FIGS. 6 and 7 are timing diagrams showing an example of the operation of the standby control circuit STBC.

As shown in FIG. 5, the standby control circuit STBC according to the second embodiment includes selectors SL1 to SL4, an AND gate AN4, a delay buffer BF11, an XOR gate XOR1, and a memory MEM, in addition to the RS latch circuit RS, the AND gates AN1 to AN3, the OR gate OR1, and the delay buffers BF1 to BF10, BF15, and BF16, which are included in the standby control circuit STBC according to the first embodiment shown in FIG. 3.

In the semiconductor device 100 according to the second embodiment, information indicating which one of the resolver/digital converters RDC1 and RDC2 is previously selected is stored in the memory (storage unit) MEM. Further, every time a reset is released, the resolver/digital converters RDC1 and RDC2 are used alternately. Accordingly, a period of time before the occurrence of a failure in the resolver/digital converters can be stochastically doubled as compared with the first embodiment in which the resolver/digital converter RDC1 is continuously used.

For example, the value of a previous selection control signal sel_pre is stored in the memory MEM which is a non-volatile memory. In this embodiment, when the resolver/digital converter RDC1 is previously selected, the selection control signal sel_pre=0, and when the resolver/digital converter RDC2 is previously selected, the selection control signal sel_pre=1. Note that the memory MEM may be provided outside of the standby control circuit STBC.

As shown in FIG. 5, in the standby control circuit STBC according to the second embodiment, the output signal from the delay buffer BF5 that corresponds to the standby signal stb2 shown in FIG. 3 is input to each of a 1-terminal of the selector SL1 and a 0-terminal of the selector SL3. The output signal from the AND gate AN1 that corresponds to the standby signal stb1 shown in FIG. 3 is input to a 0-terminal of the selector SL1 and a 1-terminal of the selector SL3. The standby signal stb2 is output from the selector SL1, and the standby signal stb1 is output from the selector SL3.

When the resolver/digital converter RDC2 is previously selected (selection control signal sel_pre=1), the resolver/digital converter RDC1 is being used, and the resolver/digital converter RDC2 is used as a standby resolver/digital converter. Accordingly, like in the case of FIG. 3, the output signal from the delay buffer BF5 becomes the standby signal stb2, and the output signal from the AND gate AN1 becomes the standby signal stb1. On the other hand, when the resolver/digital converter RDC1 is previously selected (selection control signal sel_pre=0), the resolver/digital converter RDC2 is being used, and the resolver/digital converter RDC1 is used as a standby resolver/digital converter. Accordingly, unlike in the case of FIG. 3, the output signal from the delay buffer BF5 becomes the standby signal stb1, and the output signal from the AND gate AN1 becomes the standby signal stb2.

Further, as shown in FIG. 5, in the standby control circuit STBC according to the second embodiment, the output signal from the delay buffer BF7 that corresponds to the enable signal en2 shown in en2 is input to each of the 1-terminal of the selector SL2 and the 0-terminal of the selector SL4. The output signal from the AND gate AN2 that corresponds to the enable signal en1 shown in FIG. 3 is input to each of the 0-terminal of the selector SL2 and the 1-terminal of the selector SL4. The enable signal en2 is output from the selector SL2, and the enable signal en1 is output from the selector SL4.

When the resolver/digital converter RDC2 is previously selected (when the selection control signal sel_pre=1), the resolver/digital converter RDC1 is being used, and the resolver/digital converter RDC2 is used as a standby resolver/digital converter. Accordingly, like in the case of FIG. 3, the output signal from the delay buffer BF7 becomes the enable signal en2, and the output signal from the AND gate AN2 becomes the enable signal en1. On the other hand, when the resolver/digital converter RDC1 is previously selected (selection control signal sel_pre=0), the resolver/digital converter RDC2 is being used, and the resolver/digital converter RDC1 is used as a standby resolver/digital converter. Accordingly, unlike in the case of FIG. 3, the output signal from the delay buffer BF7 becomes the enable signal en1, and the output signal from the AND gate AN2 becomes the enable signal en2.

Further, as shown in FIG. 5, in the standby control circuit STBC according to the second embodiment, the output signal from the delay buffer BF8 that corresponds to the selection control signal sel shown in FIG. 3 is inverted and input to the AND gate AN4. The AND gate AN4 also receives the output signal from the delay buffer BF4 that is delayed by the delay buffer BF11 for a delay time d11. That is, the AND gate AN4 receives the output signal from the delay buffer BF11 and the inverted signal of the output signal from the delay buffer BF8.

Specifically, the output signal from the AND gate AN4 is switched from "0" to "1" after a lapse of a delay time d1+d2+d4+d11 from a rising edge of the reset signal rst when a reset is released, and is further switched from "1" to "0" after a lapse of a delay time d5+d6+d7+d8 from a rising edge of the error signal erc. The output signal from the AND gate AN4 is input to the XOR gate XOR1. The XOR gate XOR1 also receives the selection control signal sel_pre. The output signal from the XOR gate XOR1 becomes the selection control signal sel.

Accordingly, when the resolver/digital converter RDC2 is previously selected (selection control signal sel_pre=1), the inverted signal of the output signal from the AND gate AN4 becomes the selection control signal sel. On the other hand, when the resolver/digital converter RDC1 is previously selected (selection control signal sel_pre=0), the output signal from the AND gate AN4 becomes the selection control signal sel. The selection control signal sel is stored in the memory MEM as the previous selection control signal sel_pre.

<Detailed Operation of Standby Control Circuit STBC>

Next, a control method for the semiconductor device according to this embodiment will be described with reference to FIGS. 6 and 7. Specifically, the operation of the standby control circuit STBC will be described. FIG. 6 shows a case where the resolver/digital converter RDC1 is previously selected (selection control signal sel_pre=0). FIG. 7 shows a case where the resolver/digital converter RDC2 is previously selected (selection control signal sel_pre=1).

FIGS. 6 and 7 show the reset signal rst, the standby signal stb1, the standby signal stb2, the transfer instruction ti, the enable signal en1, the enable signal en2, the error signal erc, and the selection control signal sel in order from the top. The reset signal rst, the transfer instruction ti, and the error signal erc shown in FIGS. 6 and 7 are the same as those shown in FIG. 4.

Referring first to FIG. 6, the case where the resolver/digital converter RDC1 is previously selected (selection control signal sel_pre=0) will be described. FIG. 4 relating to the first embodiment is a timing diagram when the resolver/digital converter RDC1 is being used and the resolver/digital converter RDC2 is used as a standby resolver/digital converter. On the other hand, FIG. 6 is a timing diagram when the resolver/digital converter RDC2 is being used and the resolver/digital converter RDC1 is used as a standby resolver/digital converter.

Accordingly, the standby signal stb1 shown in FIG. 6, the standby signal stb2 shown in FIG. 4, and the standby signal stb2 shown in FIG. 6 have the same waveform as that of the standby signal stb1 shown in FIG. 4. Further, the enable signal en1 shown in FIG. 6 has the same waveform as that of the enable signal en2 shown in FIG. 4, the enable signal en2 shown in FIG. 6, and the enable signal en1 shown in FIG. 4.

As shown in FIG. 6, at the time t2 after a lapse of the delay time d1 from the time t1 when a reset is released, the standby signal stb2 is switched from "0" to "1", and the supply of the power supply voltage to the power supply region PSR2 is started.

Next, at the time t3 after a lapse of the delay time d2 from the time t2, the transfer instruction ti is switched from "0" to "1", and the parameter prm is transferred from the register REG to the resolver/digital converter RDC2.

Next, at the time t4 after a lapse of the delay time d4 from the time t3, the enable signal en2 is switched from "0" to "1", and the resolver/digital converter RDC2 starts operation.

Next, at a time t12 after a lapse of the delay time d11 from the time t4, the selection control signal sel is switched from "0", which is previously selected, to "1", and the target to be selected by the selector SEL is switched from the resolver/digital converter RDC1 to the resolver/digital converter RDC2.

At the time t5 when the error signal erc, which is a pulse signal, is switched from "0" to "1", at the time t6 after a lapse of the delay time d5 from the time t5, the standby signal stb1 is switched from "0" to "1", and the supply of the power supply voltage to the power supply region PSR1 is started.

Next, at the time t7 after a lapse of the delay time d6 from the time t6, the transfer instruction ti is switched from "0" to "1", and the parameter prm is transferred from the register REG to the resolver/digital converters RDC1 and RDC2.

Next, at the time t8 after a lapse of the delay time d7 from the time t7, the enable signal en1 is switched from "0" to "1" and the resolver/digital converter RDC1 starts operation.

Next, at the time t9 after a lapse of the delay time d8 from the time t8, the selection control signal sel is switched from "1" to "0", and the target to be selected by the selector SEL is switched from the resolver/digital converter RDC2 to the resolver/digital converter RDC1.

Next, at the time t10 after a lapse of the delay time d9 from the time t9, the enable signal en2 is switched from "1" to "0" and the resolver/digital converter RDC2 stops operation.

Lastly, at the time t11 after a lapse of the delay time d10 from the time t10, the standby signal stb2 is switched from "1" to "0", and the supply of the power supply voltage to the power supply region PSR2 is interrupted.

Next, the case where the resolver/digital converter RDC2 is previously selected (selection control signal sel_pre=1) will be described with reference to FIG. 7. FIG. 4 relating to the first embodiment is a timing diagram when the resolver/digital converter RDC1 is being used and the resolver/digital converter RDC2 is used as a standby resolver/digital converter. FIG. 7 is also a timing diagram when the resolver/digital converter RDC1 is being used and the resolver/digital converter RDC2 is used as a standby resolver/digital converter.

Accordingly, the standby signals stb1 and stb2 shown in FIG. 7 are respectively the same as the standby signals stb1 and stb2 shown in FIG. 4. The enable signals en1 and en2 shown in FIG. 7 are respectively the same as the enable signals en1 and en2 shown in FIG. 4.

As shown in FIG. 7, at the time t2 after a lapse of the delay time d1 from the time t1 when a reset is released, the standby signal stb1 is switched from "0" to "1", and the supply of the power supply voltage to the power supply region PSR1 is started.

Next, at the time t3 after a lapse of the delay time d2 from the time t2, the transfer instruction ti is switched from "0" to "1", and the parameter prm is transferred from the register REG to the resolver/digital converter RDC1.

Next, at the time t4 after a lapse of the delay time d4 from the time t3, the enable signal en1 is switched from "0" to "1", and the resolver/digital converter RDC1 starts operation.

Next, at the time t12 after a lapse of the delay time d11 from the time t4, the selection control signal sel is switched from "1", which is previously selected, to "0", and the target to be selected by the selector SEL is switched from the resolver/digital converter RDC2 to the resolver/digital converter RDC1.

At time t5 when the error signal erc, which is a pulse signal, is switched from "0" to "1", at the time t6 after a lapse of the delay time d5 from the time t5, the standby signal stb2 is switched from "0" to "1", and the supply of the power supply to the power supply region PSR2 is started.

Next, at the time t7 after a lapse of the delay time d6 from the time t6, the transfer instruction ti is switched from "0" to "1", and the parameter prm is transferred from the register REG to the resolver/digital converters RDC1 and RDC2.

Next, at the time t8 after a lapse of the delay time d7 from the time t7, the enable signal en2 is switched from "0" to "1", and the resolver/digital converter RDC2 starts operation.

Next, at the time t9 after a lapse of the delay time d8 from the time t8, the selection control signal sel is switched from "0" to "1", and the target to be selected by the selector SEL is switched from the resolver/digital converter RDC1 to the resolver/digital converter RDC2.

Next, at the time t10 after a lapse of the delay time d9 from the time t9, the enable signal en1 is switched from "1" to "0", and the resolver/digital converter RDC1 stops operation.

Lastly, at the time t11 after a lapse of the delay time d10 from the time t10, the standby signal stb1 is switched from "1" to "0", and the supply of the power supply voltage to the power supply region PSR1 is interrupted.

While the invention has been described in terms of several embodiments, those skilled in the art will recognize that the invention can be practiced with various modifications within the spirit and scope of the appended claims and the invention is not limited to the examples described above.

Further, the scope of the claims is not limited by the embodiments described above.

Furthermore, it is noted that, Applicant's intent is to encompass equivalents of all claim elements, even if amended later during prosecution.

What is claimed is:

1. A semiconductor device comprising:
   a first resolver/digital converter formed in a first power supply region;
   a second resolver/digital converter formed in a second power supply region isolated from the first power supply region;
   a selection circuit configured to select one of the first resolver/digital converter and the second resolver/digital converter and output an input resolver signal;
   a pulse control circuit configured to generate a pulse control signal based on a digital signal converted from the resolver signal by one of the first resolver/digital converter and the second resolver/digital converter; and
   a selection control circuit configured to control the selection circuit to switch one of the first resolver/digital converter and the second resolver/digital converter to the other one of the first resolver/digital converter and the second resolver/digital converter, wherein
   the selection control circuit selects one of the first resolver/digital converter and the second resolver/digital converter and interrupts a supply of a power supply voltage to the other one of the first resolver/digital converter and the second resolver/digital converter, and
   when an error is detected in the selected one of the first resolver/digital converter and the second resolver/digital converter, the selection control circuit starts supplying the voltage to the other one of the first resolver/digital converter and the second resolver/digital converter, and switches one of the first resolver/digital converter and the second resolver/digital converter to the other one of the first resolver/digital converter and the second resolver/digital converter.

2. The semiconductor device according to claim 1, wherein every time a reset is released, the selection control circuit selects the first resolver/digital converter and interrupts the supply of the power supply voltage to the second resolver/digital converter.

3. The semiconductor device according to claim 1, wherein every time a reset is released, the selection control circuit selects the first resolver/digital converter and the second resolver/digital converter alternately.

4. The semiconductor device according to claim 3, further comprising a storage unit configured to store information indicating which one of the first resolver/digital converter and the second resolver/digital converter is selected.

5. The semiconductor device according to claim 1, further comprising a register storing a parameter used by the first resolver/digital converter and the second resolver/digital converter, wherein
   the selection control circuit instructs the register to transfer the parameter to the other one of the first resolver/digital converter and the second resolver/digital converter after starting to supply the voltage to the other one of the first resolver/digital converter and the second resolver/digital converter and before switching from one of the first resolver/digital converter and the second resolver/digital converter to the other one of the first resolver/digital converter and the second resolver/digital converter.

6. A motor control system comprising:
   a motor;
   a resolver configured to detect a rotation angle of the motor;
   a semiconductor device configured to generate a pulse control signal based on a resolver signal output from the resolver; and
   a drive circuit configured to drive the motor based on the pulse control signal, wherein
   the semiconductor device includes:
   a first resolver/digital converter formed in a first power supply region;
   a second resolver/digital converter formed in a second power supply region isolated from the first power supply region;

a selection circuit configured to select one of the first resolver/digital converter and the second resolver/digital converter and output the resolver signal received;

a pulse control circuit configured to generate the pulse control signal based on a digital signal converted from the resolver signal by one of the first resolver/digital converter and the second resolver/digital converter; and a selection control circuit configured to control the selection circuit to switch one of the first resolver/digital converter and the second resolver/digital converter to the other one of the first resolver/digital converter and the second resolver/digital converter, wherein the selection control circuit selects one of the first resolver/digital converter and the second resolver/digital converter and interrupts a supply of a power supply voltage to the other one of the first resolver/digital converter and the second resolver/digital converter, and when an error is detected in the selected one of the first resolver/digital converter and the second resolver/digital converter, the selection control circuit starts supplying the voltage to the other one of the first resolver/digital converter and the second resolver/digital converter and switches one of the first resolver/digital converter and the second resolver/digital converter to the other one of the first resolver/digital converter and the second resolver/digital converter.

7. The motor control system according to claim 6, wherein every time a reset is released, the selection control circuit selects the first resolver/digital converter and interrupts the supply of the power supply voltage to the second resolver/digital converter.

8. The motor control system according to claim 6, wherein every time a reset is released, the selection control circuit selects the first resolver/digital converter and the second resolver/digital converter alternately.

9. The motor control system according to claim 8, further comprising a storage unit configured to store information indicating which one of the first resolver/digital converter and the second resolver/digital converter is selected.

10. The motor control system according to claim 6, further comprising a register storing a parameter used by the first resolver/digital converter and the second resolver/digital converter, wherein the selection control circuit instructs the register to transfer the parameter to the other one of the first resolver/digital converter and the second resolver/digital converter after starting to supply the voltage to the other one of the first resolver/digital converter and the second resolver/digital converter and before switching from one of the first resolver/digital converter and the second resolver/digital converter to the other one of the first resolver/digital converter and the second resolver/digital converter.

11. A control method for a semiconductor device, comprising:

selecting one of a first resolver/digital converter and a second resolver/digital converter, the first resolver/digital converter being formed in a first power supply region, the second resolver/digital converter being formed in a second power supply region isolated from the first power supply region; and generating, by the selected one of the first resolver/digital converter and the second resolver/digital converter, a pulse control signal based on a digital signal converted from a resolver signal, wherein in the selection of one of the first resolver/digital converter and the second resolver/digital converter, a supply of a power supply voltage to the other one of the first resolver/digital converter and the second resolver/digital converter is interrupted, and when an error is detected in the selected one of the first resolver/digital converter and the second resolver/digital converter, the supply of the voltage to the other one of the first resolver/digital converter and the second resolver/digital converter is started and one of the first resolver/digital converter and the second resolver/digital converter is switched to the other one of the first resolver/digital converter and the second resolver/digital converter.

12. The control method for a semiconductor device according to claim 11, wherein every time a reset is released, the first resolver/digital converter is selected and the supply of the power supply voltage to the second resolver/digital converter is interrupted.

13. The control method for a semiconductor device according to claim 11, wherein every time a reset is released, the first resolver/digital converter and the second resolver/digital converter are selected alternately.

14. The control method for a semiconductor device according to claim 13, wherein information indicating which one of the first resolver/digital converter and the second resolver/digital converter is selected is stored in a storage unit.

15. The control method for a semiconductor device according to claim 11, further comprising a register storing a parameter used by the first resolver/digital converter and the second resolver/digital converter, wherein the parameter is transferred from the register storing the parameter used by the first resolver/digital converter and the second resolver/digital converter to the other one of the first resolver/digital converter and the second resolver/digital converter after starting to supply the voltage to the other one of the first resolver/digital converter and the second resolver/digital converter and before switching from one of the first resolver/digital converter and the second resolver/digital converter to the other one of the first resolver/digital converter and the second resolver/digital converter.

* * * * *